United States Patent
Wu et al.

(10) Patent No.: US 9,953,891 B2
(45) Date of Patent: Apr. 24, 2018

(54) METHOD OF FORMING POST-PASSIVATION INTERCONNECT STRUCTURE

(71) Applicant: TAIWAN SEMICONDUCTOR MANUFACTURING COMPANY, LTD., Hsinchu (TW)

(72) Inventors: Yi-Wen Wu, Xizhi (TW); Zheng-Yi Lim, Hsinchu (TW); Ming-Che Ho, Tainan (TW); Chung-Shi Liu, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 369 days.

(21) Appl. No.: 14/806,728

(22) Filed: Jul. 23, 2015

(65) Prior Publication Data
US 2015/0325539 A1 Nov. 12, 2015

Related U.S. Application Data (62) Division of application No. 13/291,508, filed on Nov. 8, 2011, now Pat. No. 9,099,396.

(51) Int. Cl.
*H01L 23/00* (2006.01)
*H01L 23/29* (2006.01)
(Continued)

(52) U.S. Cl.
CPC .......... *H01L 23/291* (2013.01); *H01L 23/293* (2013.01); *H01L 23/3171* (2013.01);
(Continued)

(58) Field of Classification Search
CPC ............ H01L 24/13; H01L 2924/0002; H01L 2224/05552; H01L 23/3114;
(Continued)

(56) References Cited

U.S. PATENT DOCUMENTS 5,925,931 A * 7/1999 Yamamoto .......... H01L 23/3114
257/737
6,326,299 B1 * 12/2001 Homma .................... C09G 1/02
257/E21.304
(Continued)

FOREIGN PATENT DOCUMENTS

| CN | 102094202 | 6/2011 |
|----|-----------|--------|
| TW | 200733273 | 9/2007 |

(Continued)

OTHER PUBLICATIONS

Office Action dated Feb. 13, 2014 from corresponding application No. TW 101112182.

*Primary Examiner* — William F Kraig
*Assistant Examiner* — Edward Chin
(74) *Attorney, Agent, or Firm* — Eschweiler & Potashnik, LLC (57) ABSTRACT

A method includes coating a passivation layer overlying a semiconductor substrate and forming an interconnect layer overlying the passivation layer. The interconnect layer includes a line region and a landing pad region. The method further includes forming a metallic layer including tin on a surface of the interconnect layer using an immersion process, forming a protective layer on the metallic layer, and exposing a portion of the metallic layer on the landing pad region of the interconnect layer through the protective layer.

20 Claims, 7 Drawing Sheets

(51) Int. Cl.
*H01L 23/31* (2006.01)
*H01L 23/525* (2006.01)

(52) U.S. Cl.
CPC .............. *H01L 24/03* (2013.01); *H01L 24/05* (2013.01); *H01L 24/11* (2013.01); *H01L 24/13* (2013.01); *H01L 24/16* (2013.01); *H01L 24/81* (2013.01); *H01L 23/525* (2013.01); *H01L 2224/0239* (2013.01); *H01L 2224/02313* (2013.01); *H01L 2224/02331* (2013.01); *H01L 2224/02381* (2013.01); *H01L 2224/0346* (2013.01); *H01L 2224/0391* (2013.01); *H01L 2224/03424* (2013.01); *H01L 2224/03452* (2013.01); *H01L 2224/03462* (2013.01); *H01L 2224/03464* (2013.01); *H01L 2224/0401* (2013.01); *H01L 2224/05008* (2013.01); *H01L 2224/05111* (2013.01); *H01L 2224/05124* (2013.01); *H01L 2224/05155* (2013.01); *H01L 2224/05164* (2013.01); *H01L 2224/05548* (2013.01); *H01L 2224/05562* (2013.01); *H01L 2224/05567* (2013.01); *H01L 2224/05573* (2013.01); *H01L 2224/05583* (2013.01); *H01L 2224/05611* (2013.01); *H01L 2224/05644* (2013.01); *H01L 2224/05647* (2013.01); *H01L 2224/08503* (2013.01); *H01L 2224/1146* (2013.01); *H01L 2224/11334* (2013.01); *H01L 2224/11849* (2013.01); *H01L 2224/13022* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/16225* (2013.01); *H01L 2224/16237* (2013.01); *H01L 2224/16503* (2013.01); *H01L 2924/00014* (2013.01); *H01L 2924/014* (2013.01); *H01L 2924/01028* (2013.01); *H01L 2924/01029* (2013.01); *H01L 2924/01047* (2013.01); *H01L 2924/01082* (2013.01); *H01L 2924/01083* (2013.01); *H01L 2924/01327* (2013.01); *H01L 2924/12042* (2013.01); *H01L 2924/2064* (2013.01)

(58) Field of Classification Search
CPC ....... H01L 2924/00; H01L 2924/01006; H01L 2924/01013; H01L 2924/01029; H01L 2924/01033; H01L 2924/01078; H01L 2924/01079; H01L 2924/014
USPC .. 257/E21.502, E23.021, E23.124, E23.146, 257/701, 702, 737, 738, 758, 778, 780, 257/784, 786; 438/107, 618
See application file for complete search history.

(56) References Cited

U.S. PATENT DOCUMENTS

| | | | | |
|---|---|---|---|---|
| 6,835,595 | B1 * | 12/2004 | Suzuki | H01L 21/56 438/107 |
| 8,164,184 | B2 | 4/2012 | Do et al. | |
| 8,324,738 | B2 * | 12/2012 | Liu | H01L 24/11 257/781 |
| 8,378,485 | B2 | 2/2013 | Bachman et al. | |
| 2002/0056741 | A1 | 5/2002 | Shieh et al. | |
| 2003/0134496 | A1 | 7/2003 | Lee et al. | |
| 2003/0194834 | A1 * | 10/2003 | Watase | H01L 23/3114 438/109 |
| 2005/0012216 | A1 * | 1/2005 | Leong | H01L 23/49816 257/751 |
| 2007/0052095 | A1 | 3/2007 | Torii et al. | |
| 2009/0115058 | A1 | 5/2009 | Yu et al. | |
| 2009/0140441 | A1 | 6/2009 | Camacho et al. | |
| 2010/0117231 | A1 * | 5/2010 | Lang | H01L 23/3114 257/738 |
| 2011/0101527 | A1 * | 5/2011 | Cheng | H01L 24/11 257/738 |
| 2011/0254161 | A1 * | 10/2011 | Hu | H01L 24/05 257/738 |
| 2012/0043654 | A1 | 2/2012 | Lu et al. | |
| 2013/0113094 | A1 | 5/2013 | Wu et al. | |

FOREIGN PATENT DOCUMENTS

| | | |
|---|---|---|
| TW | 397597 U | 2/2011 |
| TW | M398194 | 2/2011 |
| TW | 201131719 | 9/2011 |

* cited by examiner

METHOD OF FORMING POST-PASSIVATION INTERCONNECT STRUCTURE

PRIORITY CLAIM

The present application is a divisional of U.S. application Ser. No. 13/291,508, filed Nov. 8, 2011, which is incorporated herein by reference in its entirety.

TECHNICAL FIELD

This disclosure relates to the fabrication of semiconductor devices and, more particularly, to the fabrication of a post-passivation interconnect (PPI) structure.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's input/output (I/O) pads and the substrate or lead frame of the package. Structurally, a bump actually contains the bump itself and an "under bump metallurgy" (UBM) located between the bump and an I/O pad.

Wafer level chip scale packaging (WLCSP) is currently widely used for its low cost and relatively simple processes. In a typical WLCSP, post-passivation interconnect (PPI) lines such as redistribution lines (RDLs) are formed on passivation layers, followed by the formation of polymer films and bumps. The interface between the bump and the polymer layer, however, has poor adhesion and suffers moisture attack, which may induce delamination in polymer layers.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Embodiments described herein relate to the use of bump structures for use with semiconductor devices. As will be discussed below, embodiments are disclosed that utilize a bump structure for the purpose of attaching one substrate to another substrate, wherein each substrate may be a die, wafer, interposer substrate, printed circuit board, packaging substrate, or the like, thereby allowing for die-to-die, wafer-to-die, wafer-to-wafer, die or wafer to interposer substrate or printed circuit board or packaging substrate, or the like. Throughout the various views and illustrative embodiments, like reference numerals are used to designate like elements.

Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
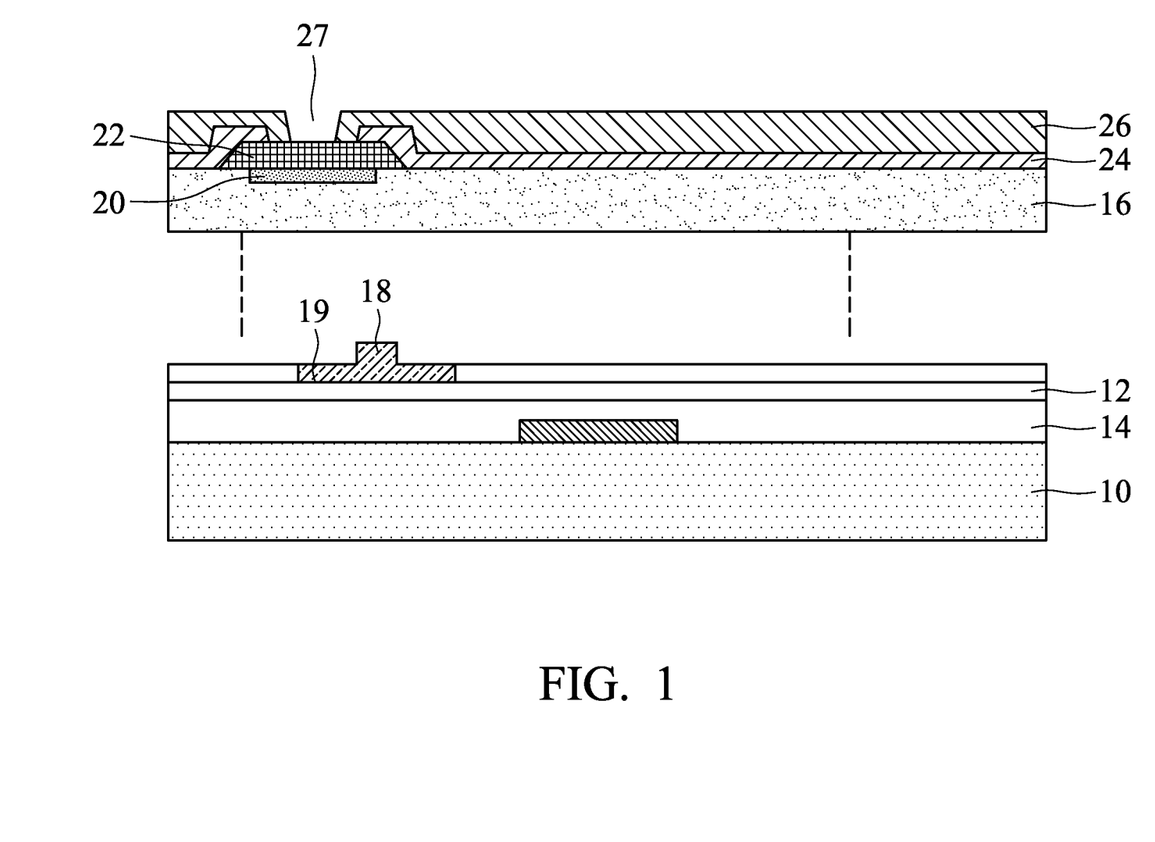
FIGS. 1-5 are cross-sectional views of illustrating various intermediate stages of a method of forming a semiconductor device having a post-passivation interconnect (PPI) structure in accordance with exemplary embodiments.

FIGS. 1-5 illustrate various intermediate stages of a method of forming a semiconductor device in accordance with an embodiment. Referring first to FIG. 1, a portion of a substrate 10 having electrical circuitry formed thereon is shown, in accordance with an embodiment. The substrate 10 may comprise, for example, bulk silicon, doped or undoped, or an active layer of a semiconductor-on-insulator (SOI) substrate. The substrate 10 may be provided as a wafer level scale or a chip level scale. Other substrates, such as a multi-layered or gradient substrate may also be used.

Electrical circuitry 12 formed on the substrate 10 may be any type of circuitry suitable for a particular application. In an embodiment, the electrical circuitry 12 includes electrical devices formed on the substrate 10 with one or more dielectric layers overlying the electrical devices. Metal layers may be formed between dielectric layers to route electrical signals between the electrical devices. Electrical devices may also be formed in one or more dielectric layers. For example, the electrical circuitry 12 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Also shown in FIG. 1 is an inter-layer dielectric (ILD) layer 14. The ILD layer 14 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). In some embodiments, the ILD layer 14 may comprise a plurality of dielectric layers. Contacts (not shown) may be formed through the ILD layer 14 to provide an electrical contact to the electrical circuitry 12. The contacts may be formed of, for example, one or more layers of TaN, Ta, TiN, Ti, CoW, copper, tungsten, aluminum, silver, or the like, or combinations thereof.

One or more inter-metal dielectric (IMD) layers 16 and the associated metallization layers 18 are formed over the ILD layer 14. Generally, the one or more IMD layers 16 and the associated metallization layers (such as metal lines 18 and vias 19) are used to interconnect the electrical circuitry 12 to each other and to provide an external electrical connection. The IMD layers 16 may be formed of a low-K dielectric material, such as FSG formed by PECVD techniques or high-density plasma CVD (HDPCVD), or the like, and may include intermediate etch stop layers. In some embodiments, one or more etch stop layers (not shown) may be positioned between adjacent ones of the dielectric layers, e.g., the ILD layer 14 and the IMD layers 16. Generally, the etch stop layers provide a mechanism to stop an etching process when forming vias and/or contacts. The etch stop layers are formed of a dielectric material having a different etch selectivity from adjacent layers, e.g., the underlying semiconductor substrate 10, the overlying ILD layer 14, and the overlying IMD layers 16. In an embodiment, etch stop layers may be formed of SiN, SiCN, SiCO, CN, combinations thereof, or the like, deposited by CVD or PECVD techniques.

In some embodiments, the metallization layers may be formed of copper or copper alloys, or of other metals. One skilled in the art will realize the formation details of the metallization layers. Further, the metallization layers include a top metal layer 20 formed and patterned in or on the uppermost IMD layer to provide external electrical connections and to protect the underlying layers from various environmental contaminants. In some embodiments, the uppermost IMD layer may be formed of a dielectric material, such as silicon nitride, silicon oxide, undoped silicon glass, and the like. In subsequent drawings, semiconductor substrate 10, electrical circuitry 12, ILD layer 14, and metallization layers 18 and 19 are not illustrated. In some embodiments, the top metal layer 20 is formed as a part of the top metallization layer on the uppermost IMD layer.

Thereafter, a conductive pad 22 is formed and patterned to contact the top metal layer 20, or alternatively, electrically coupled to top metal layer 20 through a via. In some embodiments, the conductive pad 22 may be formed of aluminum, aluminum copper, aluminum alloys, copper, copper alloys, or the like.

With reference to FIG. 1, one or more passivation layers, such as passivation layer 24, are formed and patterned over the conductive pads 22. In some embodiments, the passivation layer 24 may be formed of a dielectric material, such as undoped silicate glass (USG), silicon nitride, silicon oxide, silicon oxynitride or a non-porous material by any suitable method, such as CVD, PVD, or the like. The passivation layer 24 is formed to cover the peripheral portion of the conductive pad 22, and to expose the central portion of conductive pad 22 through the opening in passivation layer 24. The passivation layer 24 may be a single layer or a laminated layer. One of ordinary skill in the art will appreciate that a single layer of conductive pad and a passivation layer are shown for illustrative purposes only. As such, other embodiments may include any number of conductive layers and/or passivation layers.

Next, a first protective layer 26 is formed and patterned over the passivation layer 24. In some embodiments, the first protective layer 26 may be, for example, a polymer layer, which is patterned to form an opening 27, through which the conductive pad 22 is exposed. In some embodiments, the polymer layer may be formed of a polymer material such as an epoxy, polyimide, benzocyclobutene (BCB), polybenzoxazole (PBO), and the like, although other relatively soft, often organic, dielectric materials can also be used. The formation methods include spin coating or other methods.

Figure 2:
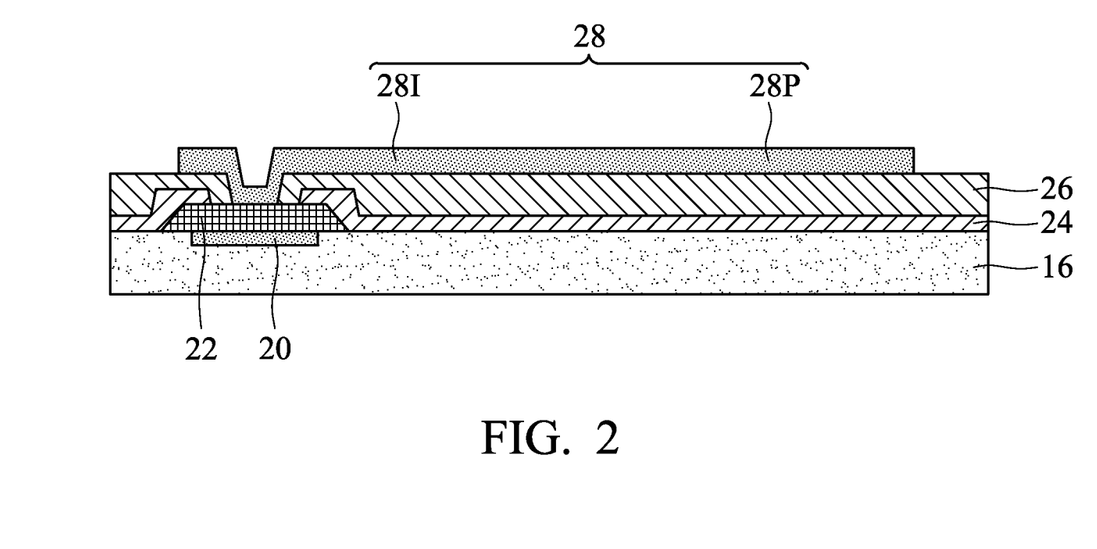

Referring to FIG. 2, at least one metallization layer is formed on the first protective layer 26 and fills the opening 27 and then patterned as an interconnect layer 28, which is electrically connected to the conductive pad 22 and may expose a portion of the first protective layer 26. In at least an embodiment, the interconnect layer 28 is a post-passivation interconnect (PPI) structure 28, which may also function as power lines, re-distribution lines (RDL), inductors, capacitors or any passive components. The PPI structure 28 includes an interconnect line region 28I and a landing pad region 28P. In some embodiments, the interconnect line region 28I and the landing pad region 28P may be formed simultaneously, and may be formed of a same conductive material. A bump feature will be formed over and electrically connected to the landing pad region 28P in subsequent processes. In some embodiments, the PPI structure 28 may include copper, aluminum, copper alloy, or other mobile conductive materials using plating, electroless plating, sputtering, chemical vapor deposition methods, and the like. In one embodiment, the PPI structure 28 includes a copper layer or a copper alloy layer. In the embodiment of FIG. 2, the landing region 28P is not directly over the conductive pad 22. In other embodiments, through the routing of PPI structure 28, the landing pad region 28P is directly over the conductive pad 22.

Figure 3:
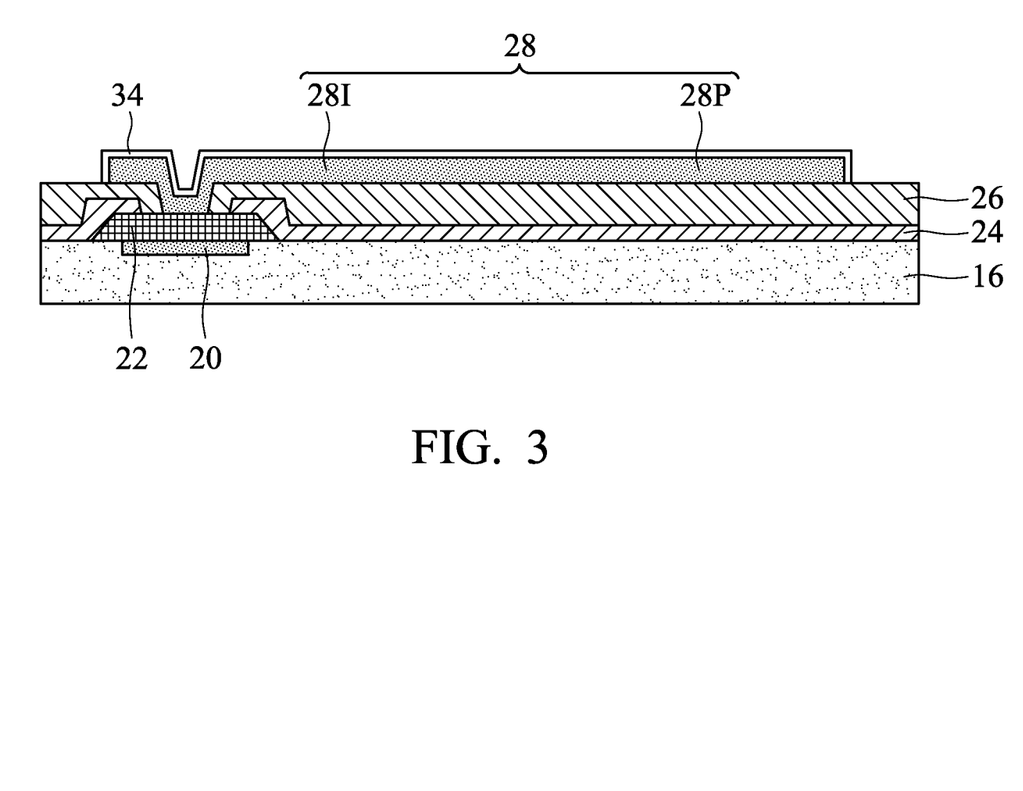

With reference to FIG. 3, a conductive layer 34 is formed on the PPI structure 28. In an embodiment, the conductive layer 34 is a metallic layer comprising tin. In some embodiments, the conductive layer 34 comprises at least one tin layer or at least one tin alloy layer. In some embodiments, the conductive layer 34 may protect the surface of the PPI structure 28 to prevent copper in the PPI structure 28 from diffusing into a bonding material. In some embodiments, the conductive layer 34 may also function as an anti-oxidation layer to prevent the copper surface of the PPI structure 28 from oxidation during subsequent processing. In some embodiments, the conductive layer 34 may further function as an adhesion layer, which improves the interface adhesion between the PPI structure 28 and a subsequently formed polymer layer. Therefore the conductive layer 34 can increase the reliability and bonding strength of a package. In some embodiments, the conductive layer 34 is less than about 3 µm thick, for example, about 0.1 µm to about 3 µm thick.

In some embodiments, the formation method of the conductive layer 34 includes an immersion process or an electroless plating process, in which the conductive layer 34 is formed on the surface of the PPI structure 28 in a self-alignment manner. In one embodiment, the conductive layer 34 is a single-layer structure including an immersion Sn layer. In one embodiment, the conductive layer 34 is a triple-layer structure including an electroless Ni layer, an electroless Pd layer, and an immersion Au layer, which is also known as an ENEPIG structure. For example, the ENEPIG structure may have the electroless Ni layer with a thickness of at least 0.5 the electroless Pd layer with a thickness of at least 0.02 µm and the immersion Au layer with a thickness of at least 0.01 µm. In one embodiment, the conductive layer 34 is a dual-layer structure including an electroless Ni layer and an electroless Pd layer, named an ENEP structure. In one embodiment, the barrier layer 34 is a dual-layer structure including an electroless Ni layer and an immersion Au layer, which is also known as an ENIG structure.

Figure 4:
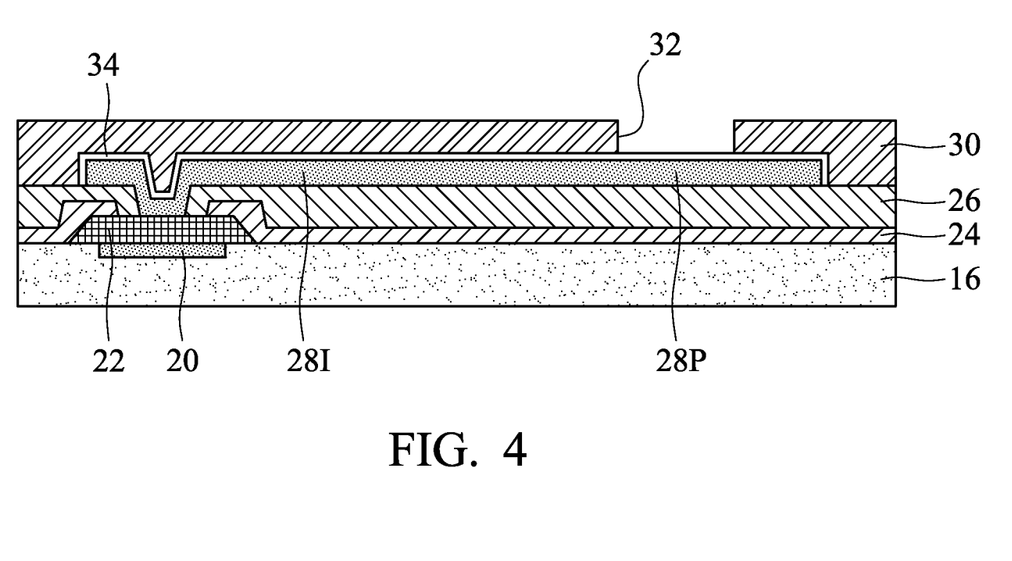

With reference to FIG. 4, a second protective layer 30 is then formed on the substrate 10 to cover the conductive layer 34. In some embodiments, the second protective layer 30 extends to cover the exposed portions of the first protective layer 26. Using photolithography and/or etching processes, the second protective layer 30 is further patterned to form an opening 32 exposing at least a portion of the conductive layer 34 in the landing pad region 28P of the PPI structure 28. The formation methods of the opening 32 may include lithography, wet or dry etching, laser drill, and/or the like. In some embodiments, the second protective layer 30 is formed of a polymer layer, such as an epoxy, polyimide, benzocyclobutene (BCB), polybenzoxazole (PBO), and the like, although other relatively soft, often organic, dielectric materials may also be used. In some embodiments, the second protective layer 30 is formed of a non-organic material selected from un-doped silicate glass (USG), silicon nitride, silicon oxynitride, silicon oxide, and combinations thereof.

Figure 5:
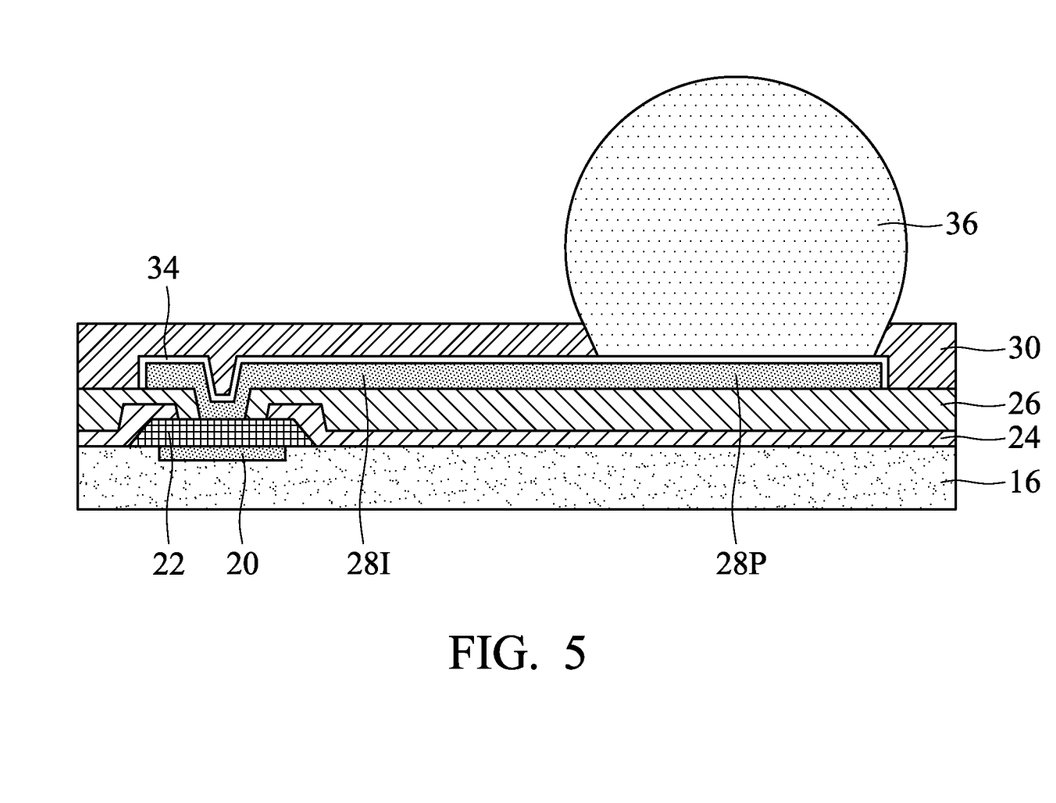

As shown in FIG. 5, a solder bump 36 is formed on the exposed portion of the conductive layer 34 so as to electrically connect to the PPI structure 28. In one embodiment, the solder bump 36 is formed by attaching a solder ball in the opening 32 and then thermally reflowing the solder material. In some embodiments, the solder bump 36 may include a lead-free pre-solder layer, SnAg, or a solder material including alloys of tin, lead, silver, copper, nickel, bismuth, or combinations thereof. In an embodiment, the solder bump 36 has a thickness greater than 30 µm. In some embodiments, the s solder bump 36 has a thickness about 40 µm to about 70 µm, although the thickness may be greater or smaller. In some embodiments, the solder bump may be formed by plating a solder layer with photolithography technologies followed by reflowing processes. In some embodiments, the solder bump 36 has a diameter of about 200 µm to about 300 µm. In other embodiments, the solder bump 36 has a diameter of about 100 µm to about 200 µm. In still other embodiments, the solder bump 36 has a diameter of about 50 µm to about 100 µm. In further embodiments, the solder bump 36 has a diameter of about 10 µm to about 50 µm. In some embodiments, the solder bump 36 includes so-called "micro-bumps".

Figure 6:
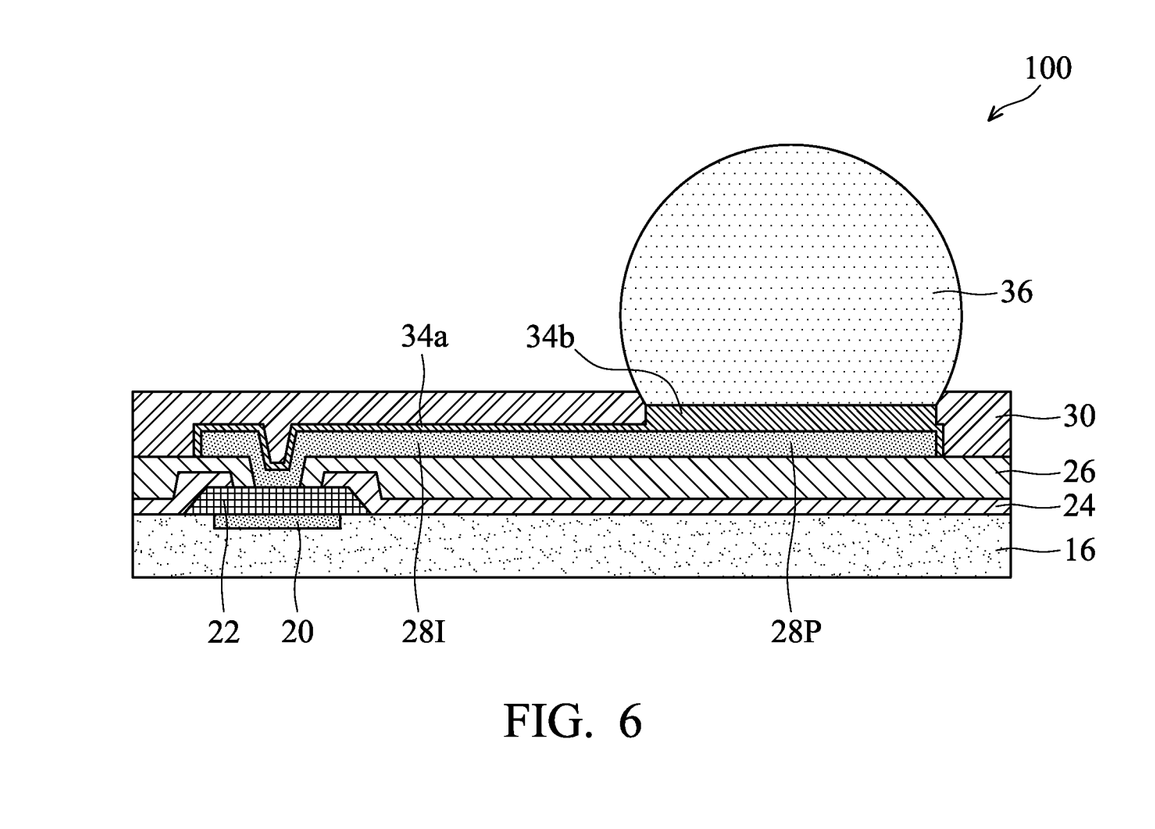
FIG. 6 is a cross-sectional view of a PPI structure with an intermetallic compound (IMC) layer in accordance with an exemplary embodiment.

In some embodiments, during the thermally reflowing process, the tin (Sn) in the conductive layer 34 tends to react with copper (Cu) in the PPI structure 28 to form an intermetallic compound (IMC) layer therebetween. In one embodiment, the conductive layer 34 is fully consumed during the IMC formation, resulting in a Cu—Sn IMC layer 34a between the PPI structure 28 and the second protective layer 30. In some embodiments, the tin (Sn) in the conductive layer 34 tends to react with tin (Sn) in the solder bump 36 and copper (Cu) in the PPI structure 28 to form another intermetallic compound (IMC) layer therebetween. In one embodiment, the conductive layer 34 is fully consumed during the IMC formation, resulting in a Cu—Sn IMC layer 34b between the solder bump 36 and the landing pad regions 28P of the PPI structure 28. In an embodiment, the Cu—Sn IMC layer 34b is thicker than the Cu—Sn IMC layer 34a. Accordingly, a semiconductor device 100 with the PPI structure 28 and the solder bmp 36 is completed.

The presented embodiments provide the conductive layer 34 as an anti-oxidation film on the PPI structure 28 to avoid copper oxidation in processing. The conductive layer 34 also serves as an adhesion film between the PPI structure 28 and the second protective layer 30, which can increase the interface adhesion between the copper layer and the polymer layer and protect the copper layer from moisture attack, and the delamination issue between the polymer layers or the delamination issue between the solder bump and the polymer layer are therefore eliminated. The conductive layer 34 further serves as a protection film between the solder bump 36 and the landing pad region 28P to prevent copper in the PPI structure 28 from diffusing into the solder material. Accordingly, in packaging assembly processes, joint reliability can be increased and bump fatigue can be reduced.

After the bump formation, for example, an encapsulant may be formed, a singulation process may be performed to singulate individual dies, and wafer-level or die-level stacking or the like may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

Figure 7:
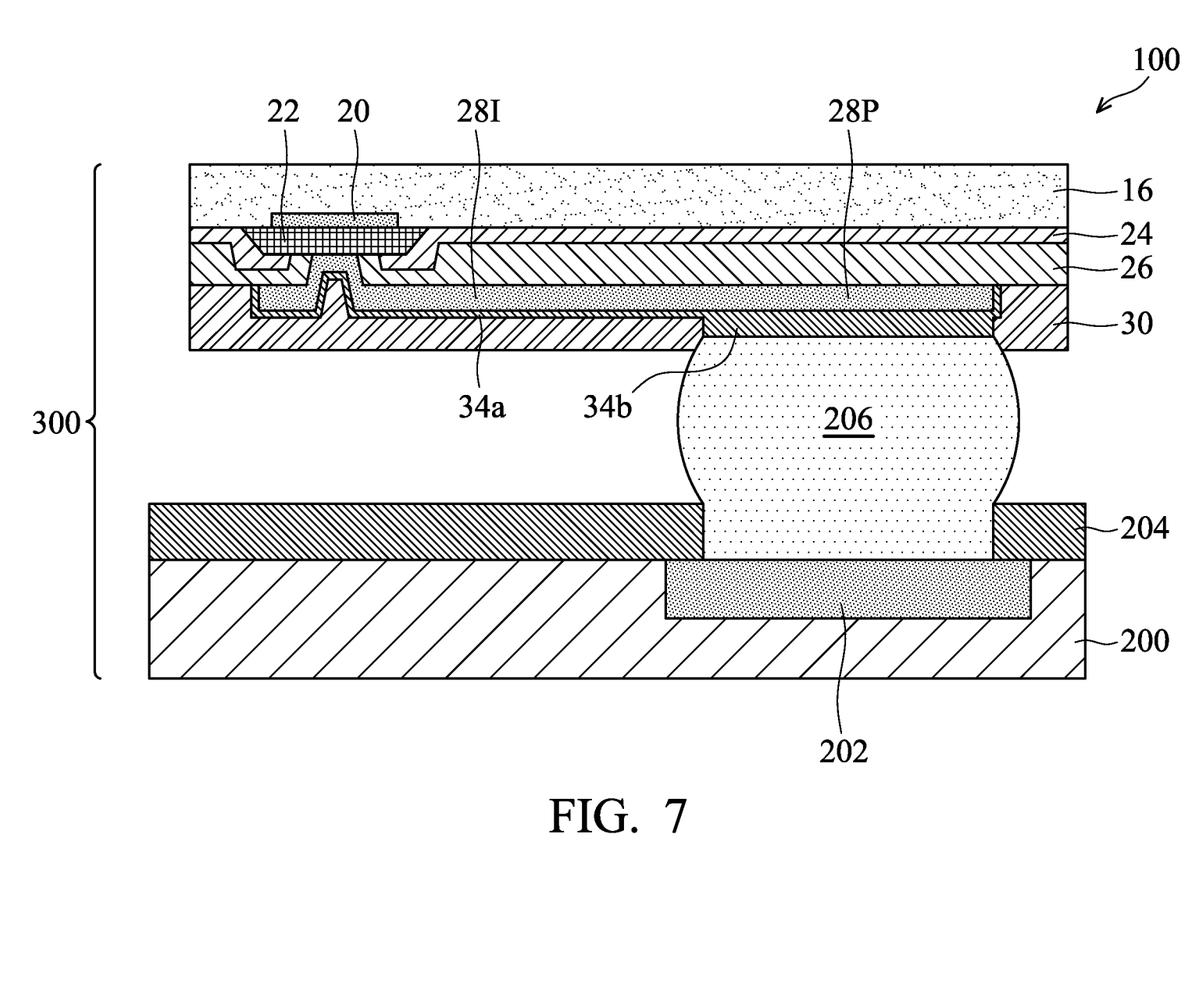
FIG. 7 is a cross-sectional view of a packaging assembly in accordance with an exemplary embodiment.

FIG. 7 is a cross-sectional diagram depicting an exemplary embodiment of a flip-chip assembly. The device 100 shown in FIG. 6 is flipped upside down and attached to another substrate 200 at the bottom of FIG. 6. In some embodiments, the substrate 200 may be a package substrate, board (e.g., a printed circuit board (PCB)), a wafer, a die, an interposer substrate, or other suitable substrate. The bump structure is coupled to the substrate 200 through various conductive attachment points. For example, a conductive region 202 is formed and patterned on the substrate 100. The conductive region 202 is a contact pad or a portion of a conductive trace, which is presented by a mask layer 204. In one embodiment, the mask layer 204 is a solder resist layer formed and patterned on the substrate 200 to expose the conductive region 202. The mask layer 204 has a mask opening, which provides a window for solder joint formation. For example, a solder layer including alloys of tin, lead, silver, copper, nickel, bismuth, or combinations thereof may be provided on the conductive region 202. In some embodiments, the device 100 can be coupled to the substrate 200 to form a joint solder structure 206 between the conductive layer 34 and the conductive region 202. An exemplary coupling process includes a flux application, chip placement, reflowing of melting solder joints, and/or cleaning of flux residue. The integrated circuit device 100, the joint solder structure 206, and the other substrate 200 may be referred to as a packaging assembly 300, or in the present embodiment, a flip-chip packaging assembly.

In accordance with one aspect of the exemplary embodiment, a method includes coating a passivation layer overlying a semiconductor substrate and forming an interconnect layer overlying the passivation layer. The interconnect layer includes a line region and a landing pad region. The method further includes forming a metallic layer including tin on a surface of the interconnect layer using an immersion process, forming a protective layer on the metallic layer, and exposing a portion of the metallic layer on the landing pad region of the interconnect layer through the protective layer.

In accordance with another aspect of the exemplary embodiment, a method of forming a packaging assembly. The method includes coating a post-passivation interconnect (PPI) structure over a substrate, forming a metallic layer comprising tin on a surface of the PPI structure using an immersion process or an electroless plating process, attaching a solder bump to the metallic layer over the landing pad region of the PPI structure, and attaching the solder bump to a conductive region of another substrate. The PPI structure includes a line region and a landing pad region.

In accordance with the other aspect of the exemplary embodiment, a method includes coating a passivation layer over a semiconductor substrate; forming a first protective layer overlying the passivation layer; forming an interconnect layer overlying the first protective layer, wherein the interconnect layer comprises a line region and a landing pad region; forming a metallic layer comprising tin on a surface of the interconnect layer using an immersion process or an electroless plating process; forming a second protective layer on the metallic layer; exposing a portion of the metallic layer on the landing pad region of the interconnect layer by forming an opening in the second protective layer; and forming a solder bump on the metallic layer in the opening of the second protective layer.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A method, comprising:
    coating a passivation layer overlying a semiconductor substrate;
    forming an interconnect layer overlying the passivation layer, wherein the interconnect layer comprises a line region and a landing pad region;
    forming a metallic layer comprising tin on and in contact with a surface of the interconnect layer using an immersion process;
    forming a protective layer on the metallic layer; and
    exposing a portion of the metallic layer on the landing pad region of the interconnect layer through the protective layer.

2. The method of claim 1, further comprising forming a solder bump on the exposed portion of the metallic layer.

3. The method of claim 2, further comprising forming an intermetallic compound layer comprising tin and copper between the interconnect layer and the solder bump.

4. The method of claim 2, further comprising performing a thermal reflowing process on the solder bump.

5. The method of claim 1, further comprising forming an intermetallic compound layer comprising tin and copper between the interconnect layer and the protective layer.

6. The method of claim 1, wherein forming the protective layer on the metallic layer comprises forming the protective layer including a polymer.

7. The method of claim 1, wherein forming the interconnect layer overlying the passivation layer comprises forming the interconnect layer comprising copper or a copper alloy.

8. The method of claim 2, further comprising attaching the solder bump to a conductive region of another substrate.

9. The method of claim 1, wherein the metallic layer is arranged over the line region and the landing pad region.

10. The method of claim 1, wherein the metallic layer is between the protective layer and the interconnect layer.

11. A method of forming a packaging assembly, the method comprising:
    coating a post-passivation interconnect (PPI) structure over a substrate, wherein the PPI structure comprises a line region and a landing pad region;
    forming a metallic layer comprising tin on a surface of the PPI structure using an immersion process or an electroless plating process;
    attaching a solder bump to the metallic layer over the landing pad region of the PPI structure, wherein the metallic layer laterally extends past one or more sides of the solder bump; and
    attaching the solder bump to a conductive region of another substrate.

12. The method of claim 11, further comprising forming an intermetallic compound layer comprising tin and copper between the PPI structure and the solder bump.

13. The method of claim 11, further comprising:
    forming a protective layer on the metallic layer; and
    removing a portion of the protective layer to expose a portion of the metallic layer on the landing pad region of the PPI structure.

14. The method of claim 13, further comprising forming an intermetallic compound layer comprising tin and copper between the PPI structure and the protective layer.

15. A method, comprising:
    coating a passivation layer over a semiconductor substrate;
    forming a first protective layer overlying the passivation layer;
    forming an interconnect layer overlying the first protective layer, wherein the interconnect layer comprises a line region and a landing pad region;
    forming a metallic layer comprising tin on a surface of the interconnect layer using an immersion process or an electroless plating process;
    forming a second protective layer over the metallic layer;
    exposing a portion of the metallic layer over the landing pad region of the interconnect layer by forming an opening in the second protective layer; and
    forming a solder bump on the metallic layer in the opening of the second protective layer.

16. The method of claim 15, further comprising forming an intermetallic compound (IMC) layer comprising tin and copper on the surface of the interconnect layer.

17. The method of claim 16, wherein forming the IMC layer comprises:
    forming a first IMC portion between the line region and the second protective layer; and
    forming a second IMC portion between the landing pad region and the solder bump, wherein the second IMC portion is thicker than the first IMC portion.

18. The method of claim 15, further comprising performing a thermal reflowing process on the solder bump.

19. The method of claim 15, wherein forming the metallic layer comprises the metallic layer having a thickness less than about 3 µm.

20. The method of claim 15, wherein forming the solder bump comprises forming the solder bump comprising tin or an alloy including one or more of at least one of tin, lead, silver, copper, nickel or bismuth.

\* \* \* \* \*